US011099949B2

(12) United States Patent
Kost et al.

(10) Patent No.: US 11,099,949 B2
(45) Date of Patent: Aug. 24, 2021

(54) METHOD APPARATUS FOR RESUMING AND RECOVERY CHECKING FROM INTERRUPTED PROGRAMMING OF ONE-TIME PROGRAMMABLE MEMORY DEVICE

(71) Applicant: Cirrus Logic International Semiconductor Ltd., Edinburgh (GB)

(72) Inventors: Michael A Kost, Cedar Park, TX (US); Bradley A Lambert, Austin, TX (US); John P Tourish, Dripping Springs, TX (US); Girish Subramaniam, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 140 days.

(21) Appl. No.: 16/529,636

(22) Filed: Aug. 1, 2019

(65) Prior Publication Data
US 2020/0104221 A1  Apr. 2, 2020

Related U.S. Application Data

(60) Provisional application No. 62/714,179, filed on Aug. 3, 2018.

(51) Int. Cl.
*G06F 11/14* (2006.01)
*G11C 17/18* (2006.01)

(52) U.S. Cl.
CPC .......... *G06F 11/1474* (2013.01); *G11C 17/18* (2013.01); *G06F 2201/82* (2013.01)

(58) Field of Classification Search
CPC .. G06F 11/14; G06F 11/1474; G06F 11/1012; G06F 11/1048; G11C 17/18
See application file for complete search history.

(56) References Cited

U.S. PATENT DOCUMENTS

| | | | | |
|---|---|---|---|---|
| 5,715,431 A * | 2/1998 | Everett | ................ | G11C 16/102 711/156 |
| 6,006,305 A * | 12/1999 | Fox | ...................... | G11C 16/102 365/120 |
| 6,728,137 B1 * | 4/2004 | Lin | ...................... | G11C 16/102 365/185.05 |
| 6,789,159 B1 * | 9/2004 | Carr | ...................... | G11C 16/22 365/185.33 |
| 6,957,295 B1 * | 10/2005 | Estakhri | ................ | G06F 3/0607 365/185.11 |
| 7,613,913 B2 * | 11/2009 | Haban | ...................... | G06F 8/60 713/1 |

(Continued)

*Primary Examiner* — Kamini B Patel
(74) *Attorney, Agent, or Firm* — E. Alan Davis; James W. Huffman

(57) ABSTRACT

A method and apparatus for programming a one-time programmable (OTP) memory device is disclosed that allows for resuming and recovering from an interrupted programming cycle (e.g. due to loss of power or user interaction). Upon re-initiation of a programming cycle with the same memory range, a programming controller may detect the memory address where interruption occurred, and resume programming from that address. If the programming interruption resulted in an incorrectly programmed word at the interrupted address, a word repair register may be mapped to the corrupted address to enable correction of that word. The remainder of the memory range may then be programmed normally.

18 Claims, 7 Drawing Sheets

(56) References Cited

U.S. PATENT DOCUMENTS

| | | | | |
|---|---|---|---|---|
| 7,689,760 | B2* | 3/2010 | Carr | G11C 16/22 |
| | | | | 711/103 |
| 8,022,766 | B2* | 9/2011 | Dupuis | H03F 1/0261 |
| | | | | 330/285 |
| 8,751,786 | B1* | 6/2014 | Feng | H04L 9/0897 |
| | | | | 713/2 |
| 8,966,233 | B2* | 2/2015 | Haban | G06F 8/60 |
| | | | | 713/1 |
| 2004/0268024 | A1* | 12/2004 | Carr | G11C 16/22 |
| | | | | 711/103 |
| 2005/0105331 | A1* | 5/2005 | Lee | G11C 16/22 |
| | | | | 365/185.11 |
| 2007/0226400 | A1* | 9/2007 | Tsukazaki | G06F 16/10 |
| | | | | 711/102 |
| 2008/0043508 | A1* | 2/2008 | Chao | G11C 17/18 |
| | | | | 365/94 |
| 2010/0009640 | A1* | 1/2010 | Haban | G06F 8/60 |
| | | | | 455/77 |
| 2010/0103738 | A1* | 4/2010 | Chen | G06F 12/0238 |
| | | | | 365/185.11 |
| 2011/0087898 | A1* | 4/2011 | Williams | G06F 21/31 |
| | | | | 713/193 |
| 2014/0071726 | A1* | 3/2014 | Chung | G11C 17/08 |
| | | | | 365/49.17 |
| 2014/0223078 | A1* | 8/2014 | Gravelle | G06F 3/0679 |
| | | | | 711/103 |

* cited by examiner

FIG. 7

METHOD APPARATUS FOR RESUMING AND RECOVERY CHECKING FROM INTERRUPTED PROGRAMMING OF ONE-TIME PROGRAMMABLE MEMORY DEVICE

CROSS REFERENCE TO RELATED APPLICATION(S)

This application claims priority based on U.S. Provisional Application Ser. No. 62/714,179, filed Aug. 3, 2018, which is hereby incorporated by reference in its entirety.

BACKGROUND

Technical Field

The embodiments described below relate to devices which include a one-time programmable (OTP) memory.

The use of one-time programmable (OTP) memory integrated along with other Complementary Metal-Oxide-Semiconductor (CMOS) circuitry into a single device has primarily been used to provide: a method to program (or burn) chip-level unique calibration values at manufacture time (e.g., such as disclosed in U.S. Pat. No. 8,022,766), or to provide a method to deploy the latest available firmware for a programmable device such as a microcontroller unit (MCU) more easily than what could be accomplished via a change to the device's read only memory (ROM), again done at manufacture time (e.g., such as disclosed in U.S. Pat. No. 7,613,913).

In these use-cases, there may be MCU firmware responsible for programming the OTP memory at manufacture time, typically via some method of transferring data to the MCU random access memory (RAM), and then having the firmware perform the transfer of data from the RAM buffer to the OTP memory following any required OTP-specific programming sequence (e.g. waiting for BUSY, checking for STATUS after burning each word). The OTP-programming firmware may be downloaded to the MCU at the manufacturing site and may not even be present in the deployed MCU firmware itself, thereby restricting programming to manufacture time only such as disclosed in U.S. Pat. No. 7,613,913. Similarly, some devices may also opt to not include a charge pump or other supply circuitry necessary to program the OTP memory within the integrated circuit in order to save die area, and instead opt to use an external supply voltage for programming at the manufacturing site, again restricting programming to manufacture time only.

Restricting OTP programming to manufacture time is understandable given the nature of the OTP itself: any errors in programming may render a device useless or incapable of performing subsequent updates. Such errors may be introduced if power to the device was interrupted while programming the OTP, a scenario which must be accounted for when an end-user performs in-field updates.

Some OTP memories are all-zero when un-programmed, and bits may only change from a "0" to a "1," and once set to a "1," cannot revert back to a "0." Additionally, an error correction code (ECC) bank will typically be integrated into the OTP (which is a separate array of bits within the OTP), which precludes a second pass on a partially programmed word, e.g., if an interrupted programming sequence resulted in some bits of a given OTP memory location not being set to 1, a second programming pass to attempt to set these un-programmed bits to 1 would be invalid given the ECC value that was burned during the first pass. The same limitation should apply to OTP memories that are indeterministic or all-one when un-programmed.

Existing solutions relating to the detection of interrupted programming of an OTP exist, such as disclosed in U.S. Pat. No. 7,689,760, but have no provision for recovery and, thus only rendering the non-volatile memory non-operational. Such solutions are not robust for in-field update, because any interruption results in a non-operational memory.

SUMMARY

An embedded device having integrated one-time programmable memory (OTP) together with a memory controller unit (e.g. MCU) and a bank of word repair registers is disclosed, along with an algorithm implemented on the memory controller unit which enables multiple re-tries at programming, as well as repair of corrupted memory locations in the OTP in the event of a failure due to an interruption of the programming sequence. The method and apparatus provide robust in-field programming with a repair mechanism of the OTP, enabling reliable manufacture time or in-field updates of firmware or configuration data to the embedded device. The repair mechanism described herein may also be extended to perform manufacture time or in-field repair of memory locations corrupted by failures other than interruption of programming.

In one embodiment, the present disclosure provides a system that includes a non-volatile one-time programmable (OTP) memory device. During a programming operation of the non-volatile OTP memory device, in response to the system beginning a field update, the system detects for a prior programming attempt of the non-volatile OTP memory device. In response to the system detecting the prior programming attempt, the system determines and identifies corrupted OTP content at an address and selectively stores correction information in the non-volatile OTP memory device and resumes programming the field update. The correction information includes the address of the corrupted OTP content and correct data from the field update. During a read operation that specifies the corrupted OTP content address previously stored in the non-volatile OTP memory device, the system uses the correction information to return to the read operation the correct data rather than the corrupted OTP content from the non-volatile OTP memory device.

In another embodiment, the present disclosure provides an apparatus that includes a one-time programmable (OTP) memory, a controller for controlling programming of the OTP memory, and word repair registers loadable with data and mappable to an address of the OTP memory. The controller is configured to detect that a previous attempt to program a memory region of the OTP memory was interrupted, resume programming the OTP memory at an address where the previous programming attempt was interrupted leaving a word at the address partially programmed, and load the word repair registers with correct data for the address and map the word repair registers to the address of the OTP memory that has been partially programmed due to interruption.

In yet another embodiment, the present disclosure provides a method that includes receiving from a host content to be programmed to a device having a one-time programmable (OTP) memory. The method also includes detecting that the OTP memory has already been previously programmed. The method also includes determining whether a word of the content to be programmed at a first location of the OTP memory does not match a corresponding word currently in the first location. The method also includes programming, selectively based on the determining, correction information to a second location of the OTP memory different from the first location. The correction information includes the word of the content to be programmed and an address of the first location. The method also includes detecting, subsequent to the programming, a request to read an address of the OTP memory that matches the address included in the correction information. The method also includes returning to the read request the word included in the correction information from the second location as a substitute for the word currently in the first location.

BRIEF DESCRIPTION OF THE DRAWINGS

FIG. 7 shows example OTP contents after an interrupted programming sequence together with the re-programmed and corrected OTP contents.

DETAILED DESCRIPTION

Figure 1:
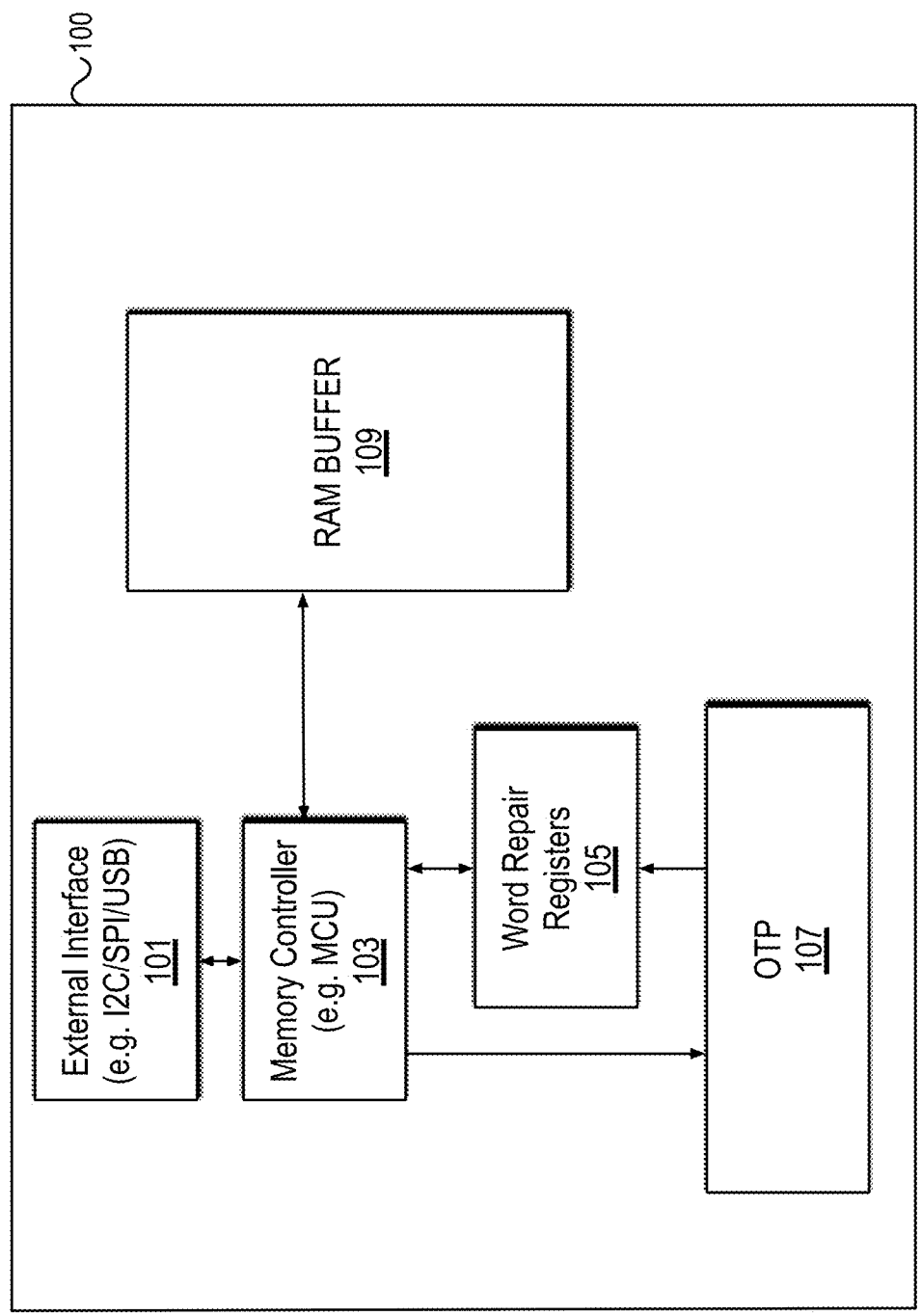
FIG. 1 is a block diagram of an example device.

FIG. 1 shows a block diagram of an example embodiment of a device 100 containing a memory controller unit 103 (e.g. MCU), external interface 101 (e.g. I2C, serial peripheral interface (SPI), universal serial bus (USB)), RAM buffer 109, OTP 107, and bank of word repair registers 105, in addition to the bus connections between these components. Although the figure for the example embodiment shows the use of hardware-based word repair registers 105 as a volatile storage component for holding valid address/data pairs that are used to substitute for a corrupted data value on read-back of an address holding corrupted data (as the hardware-based word repair register 105 scheme provides a convenient method for performing the substitution in a manner transparent to the firmware, e.g., executed on MCU 103), various embodiments may use a firmware-based scheme that will perform the substitution in an explicit manner after detecting that a read-back of a corrupted address was attempted.

Figure 2:
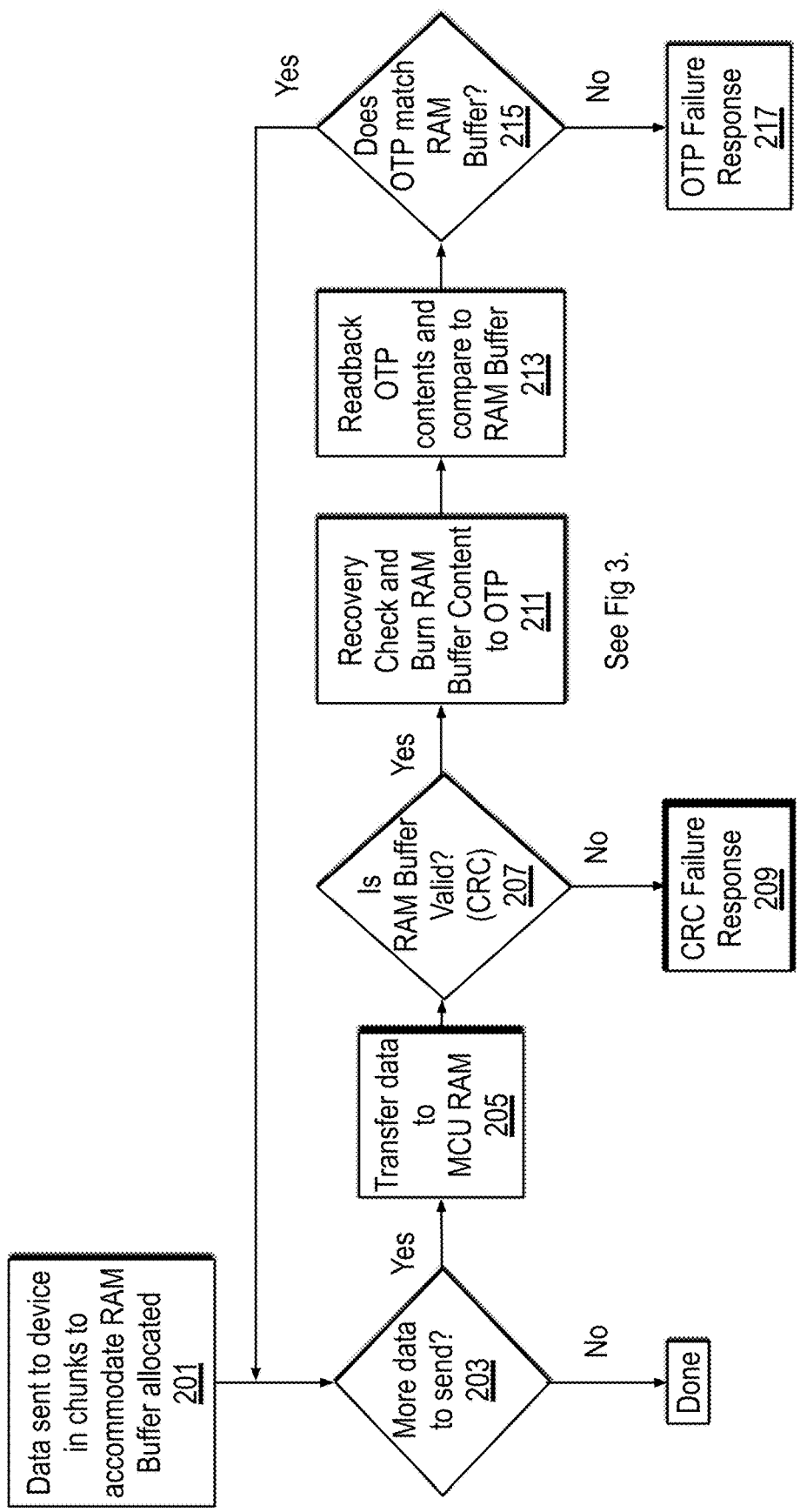
FIG. 2 is an example flowchart of a top-level OTP programming sequence.

FIG. 2 shows a flow chart of an example embodiment of an OTP programming sequence in accordance with the present disclosure, whereby an external device (or host) will send data to the embedded device (e.g., device 100 of FIG. 1) to have programmed to the OTP memory (e.g., OTP 107 of FIG. 1) of the device. A transmission channel used by various embodiments to transfer data from the external device to the embedded device containing OTP memory is independent of the disclosed method and apparatus, and may typically include serial links such as I2C, SPI, and USB.

Various embodiments may split the data up (steps 201 and 203) to accommodate the transmission channel or the size of the RAM buffer (e.g., RAM buffer 109 of FIG. 1) required within the embedded device as a staging area for performing a cyclic redundancy check (CRC) calculation (e.g., by memory controller 103 of FIG. 1) and for comparing against the current OTP contents. Metadata within the data transmission packet provides the data length and OTP address for a payload, as well as a CRC value covering the payload together with the data length and OTP address metadata. After receiving the data via the transmission channel into the RAM buffer (step 205), the validity of the received data is determined via a CRC calculation and checked against the CRC value contained within the packet (step 207). If the calculated CRC value does not match the value contained within the packet, the external device is notified with a CRC Failure response (step 209).

On passing the CRC check, the data in the RAM buffer is programmed to the OTP memory (step 211). In the example embodiment, step 211 includes checks for resuming and recovery (see FIG. 3) by detecting if there was an unfinished attempt to program the OTP memory region targeted by this packet and, if so, selectively performing word repair (e.g., step 319 of FIG. 3) and resuming burning of the RAM buffer content to the OTP memory (e.g., step 321 of FIG. 3). After the resuming and recovery checks, the OTP content are read back and compared with the RAM buffer content (step 213). If the OTP content does not match the RAM buffer content (step 215), the external device is notified with an OTP Failure response (step 217). Otherwise, operation returns to step 203.

Figure 3:
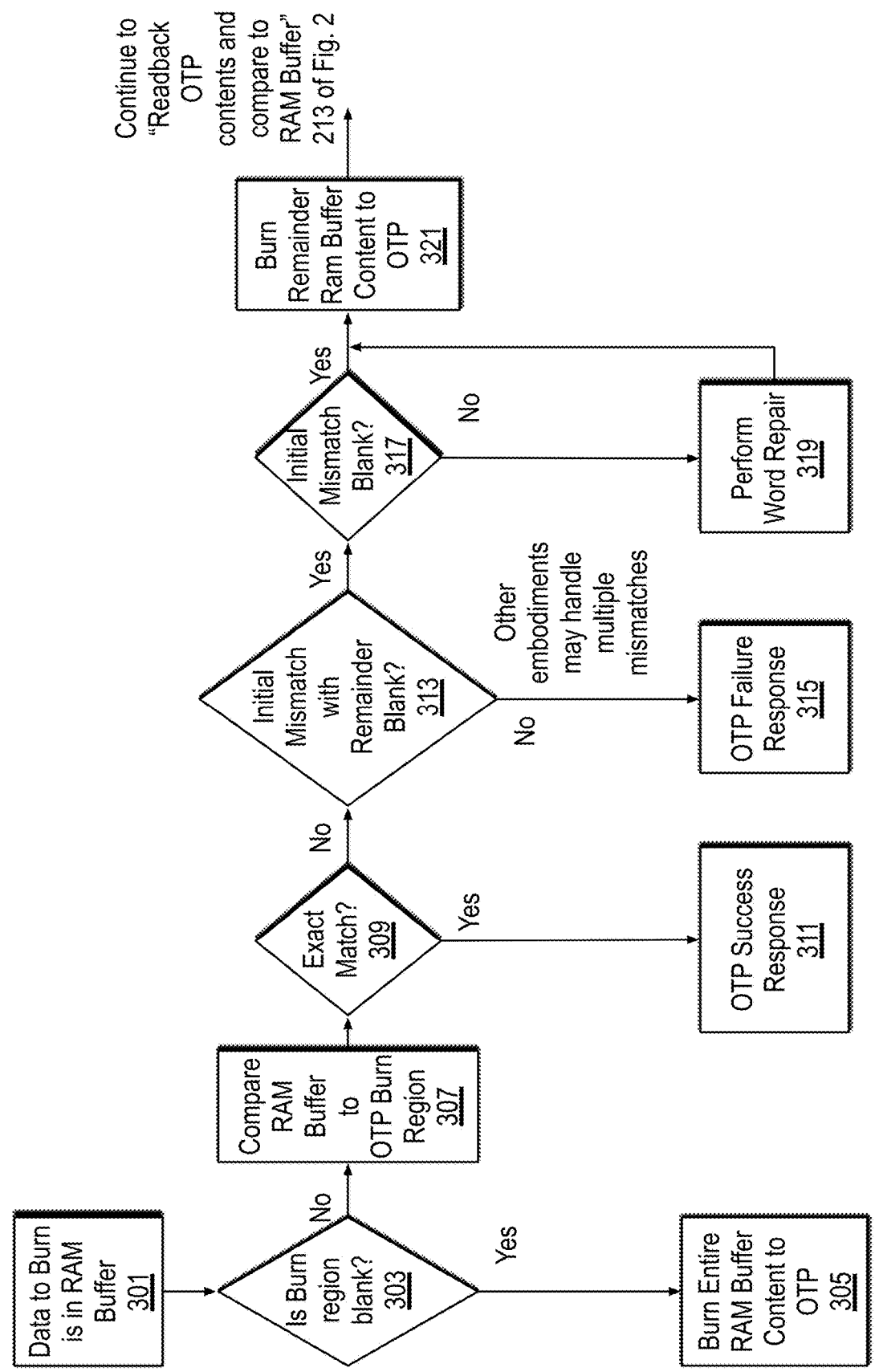
FIG. 3 is an example flowchart of an OTP programming detailing resuming and recovery checking.

FIG. 3 shows an example flowchart of an OTP programming detailing resuming and recovery checking once the data to burn into the OTP is in the RAM buffer (step 301, e.g., per step 205 of FIG. 2). First, the OTP memory region targeted by this packet is blank-checked (step 303), i.e., checked to see if it is completely filled with values equivalent to the un-programmed state of the OTP memory. If the OTP memory region is blank, then there has been no attempt to previously program this memory region, so programming of the entire memory region may proceed as normal (step 305), and no further resuming or recovery logic is needed.

If the OTP memory region is not blank, then the next check is to compare the RAM buffer against the contents of the OTP memory region (step 307). If (step 309) the two exactly match, then there has been a previous attempt to program this OTP memory region which was successful; therefore, the external device is notified with an OTP Success response (step 311). This scenario is an expected result for zero or more regions when a previously-failed in-field update is repaired.

If the OTP memory region is neither blank nor matches the RAM buffer completely, then the first address in the OTP memory region that differs from the RAM buffer is found. Typical power-supply disruptions of OTP programming results in a partially programmed OTP memory region, with an initial mismatch between the OTP memory and the RAM buffer, which is the address where programming was in-process when the disruption occurred, followed by a blank (un-programmed) OTP memory region for the remainder of the programming region (step 313). If the remainder of the OTP burn region after the initial mismatch is not blank (or if there are an excessive number of mismatches—see below), then the external device is notified with an OTP Failure response (step 315).

Various embodiments may compare the contents of the OTP memory region against the RAM buffer until the first mismatch is found, then verify that the remainder of the OTP memory region is blank. Other embodiments may handle multiple mismatches, given that an adequate number of word repair registers are provided. If the OTP address of the first mismatch between the OTP memory region and the RAM buffer contains a value equivalent to the un-programmed state of the OTP memory (317), then there is no need to perform word repair (since any un-programmed bits in an OTP memory may be programmed), and the remainder of the OTP memory region may be programmed normally from the mismatch address (step 321). This situation is considered the "Resume" case.

If the OTP address of the first mismatch between the OTP memory region and the RAM buffer contains a programmed value, then word repair of that OTP memory address (step 319) is required (before burning the remainder of the RAM buffer content to the OTP) and this scenario is considered the "Recovery" case. Once the remainder of the RAM buffer content is burned into the OTP, the operation continues back to step 213 of FIG. 2.

Figure 4:
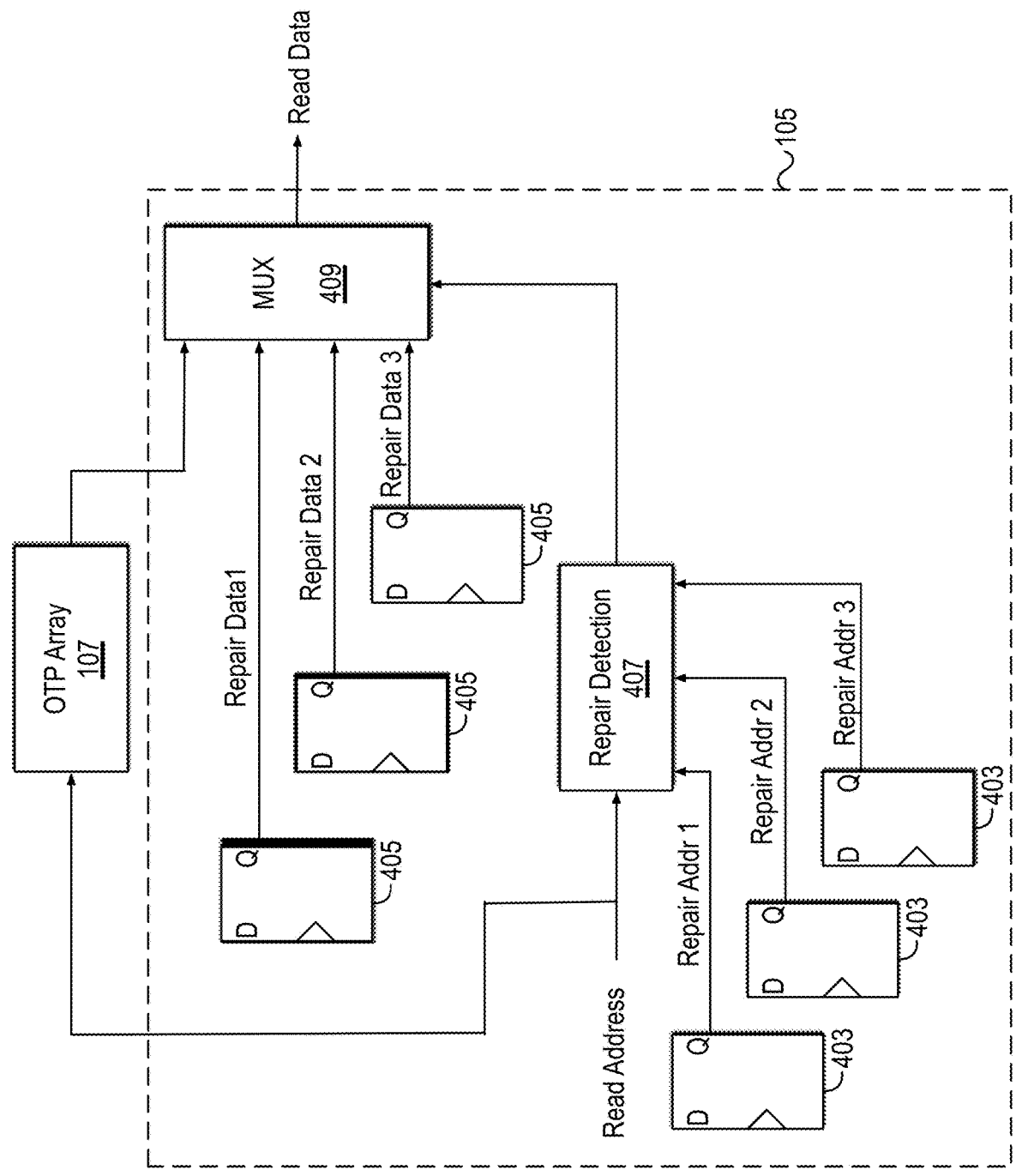
FIG. 4 shows example word repair registers multiplexed with an OTP array.

FIG. 4 illustrates the organization of word repair registers (e.g., Word Repair Registers 105 of FIG. 1) as address-data pairs in accordance with the present disclosure. Various embodiments may include word repair address registers 403 in a multiplexed arrangement such that addressing logic substitutes (e.g., repair detection logic 407 controlling mux 409 Read Data output) the data value of a word repair data register 405 (Repair Data 1, Repair Data 2, or Repair Data 3 provided to mux 409) for the data read back from the OTP memory (e.g., OTP 107 of FIG. 1) at a particular OTP memory read-back address (Read Address input) if the OTP read-back address is found within one of the word repair address registers 403 (Repair Address 1, Repair Address 2, or Repair Address 3), instead of the (corrupted, repaired, or replaced) data value found at that address within the OTP memory 107 (provided to mux 409). Otherwise, the repair detection logic 407 controls the mux 409 to select for output as the Read Data the data value output by the OTP memory 107.

Other embodiments may perform word repair address detection and read-back data substitution in firmware rather than hardware. The firmware-based embodiment uses a similar organization of word repair address-data pairs but performs memory address matching and data substitution in firmware. A further optimization of the firmware substitution mechanism is to only attempt memory address matching when the OTP memory hardware indicates a mismatch between read-back data and its ECC signature. The "Recovery" case of a firmware-based repair scheme (e.g., at step 319 of FIG. 3) is substantially identical to a hardware-based repair scheme, except additionally the first mismatch data contained in the OTP memory is invalidated to guarantee the ECC checking hardware indicates a mismatch between read-back data and its ECC signature on subsequent read attempts. In one embodiment, the first mismatch data in the OTP memory is invalidated by a second write attempt to the OTP memory location with a chosen data value that inverts one or more bits to guarantee the ECC signature for the original (but incorrect) data does not match the ECC signature expected for the invalidated (overwritten) data. The data value for invalidating a second write attempt is a function of the ECC algorithm and the original (incorrect) data.

Figure 5:
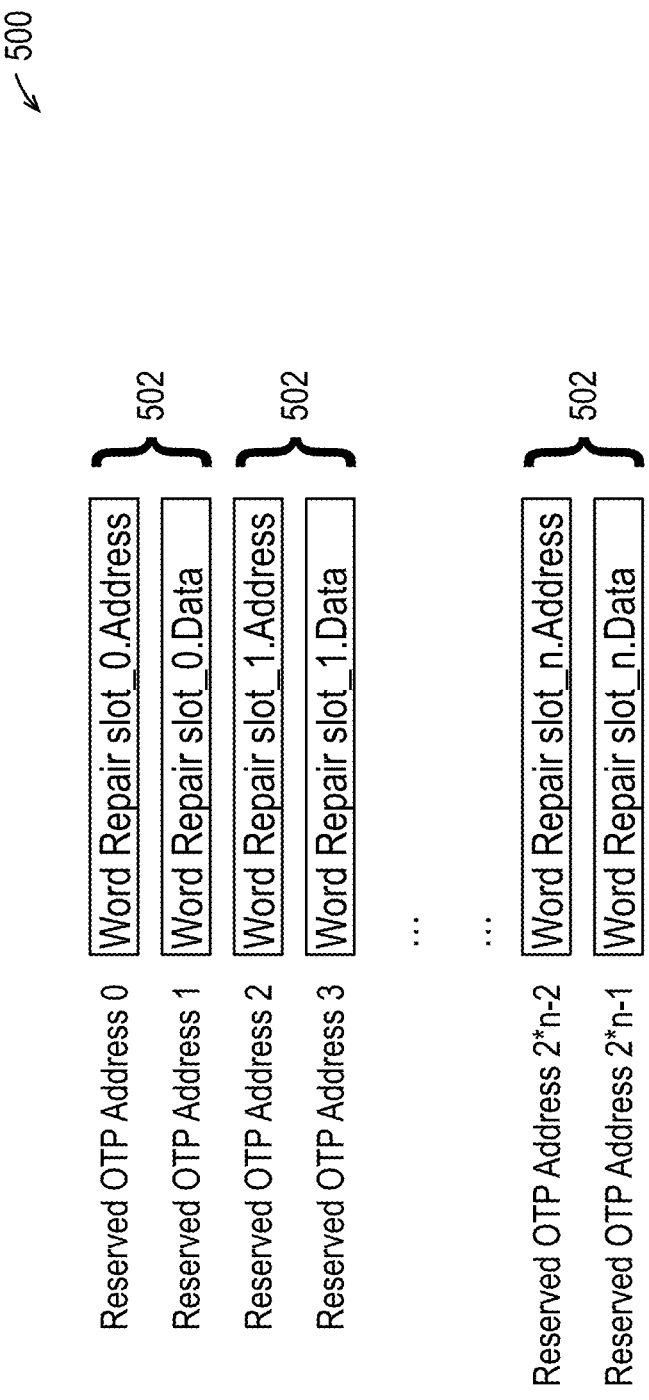
FIG. 5 shows example reserved locations in OTP memory holding word repair address-data pairs that are loaded into the word repair registers.

FIG. 5 shows an example of reserved locations in OTP (e.g., OTP 107 of FIG. 1) within a reserved region 500 used for holding word repair Address-Data slots 502. Loading of the word repair address-data register pairs (e.g., 403/405 of FIG. 4) is under control of the memory controller unit (e.g. MCU 103 of FIG. 1). The word repair address-data register pairs are loaded at power-up from the word repair Address-Data slots 502 in the OTP reserved region 500 that contain the Address-Data pairs for each OTP memory location that has been repaired. More specifically, at power-up, for each valid slot 502 (e.g., in the example of FIG. 7, bit 31 of the word repair Address is set), the word repair Address of the slot 502 is loaded into a word repair address register 403 and the corresponding word repair Data of the slot 502 is loaded into the corresponding word repair data register 405. The number of reserved locations required in OTP depends on the number of word repair address-data register pairs that are contained within a given embodiment.

Figure 6:
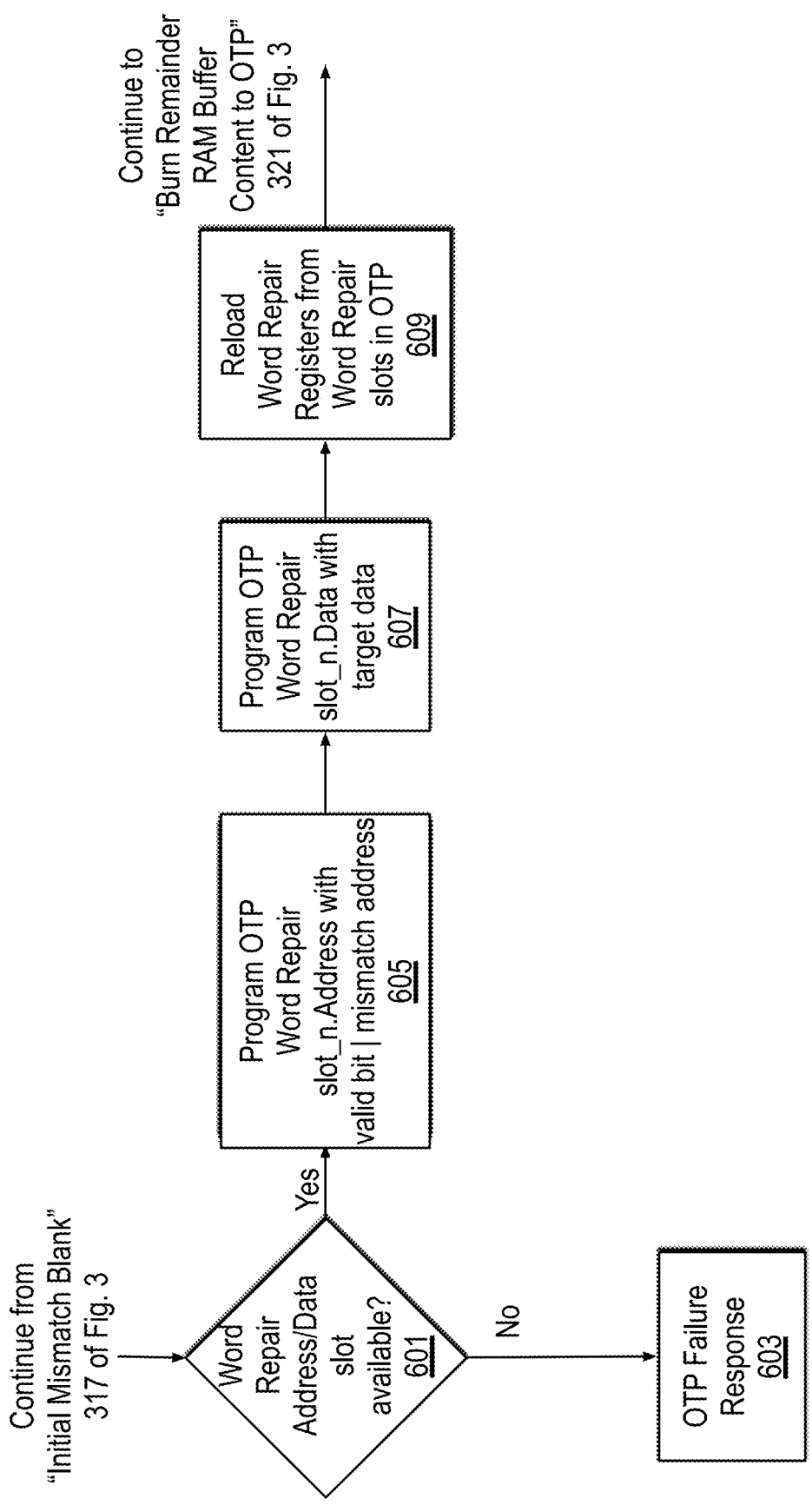
FIG. 6 shows an example flowchart for performing word repair.

FIG. 6 shows the word repair process (e.g., step 319 of FIG. 3) in detail. First, an available word repair Address-Data pair slot (e.g., 502 of FIG. 5) in the reserved OTP memory region (e.g., 500 of FIG. 5) is searched for (step 601). The slot is determined by searching through the reserved OTP memory region (500 of FIG. 5) and finding the first unprogrammed Address-Data pair slot. If none are found, then the available word repair registers (e.g., 403/405 of FIG. 4) have already been exhausted, and since there will be no ability to correct the mis-programmed word with a hardware-based scheme, the external device is notified with an OTP Failure response (step 603). The word repair address register (e.g., 403 of FIG. 4) contains a valid bit to enable the word repair register to be included (e.g., via control by repair detection logic 407 of FIG. 4) in the mux (e.g., mux 409 of FIG. 4) for the OTP array addressing logic, i.e., the repair detection logic 407 only looks for a match of the Read Address of FIG. 4 with Repair Addresses of word repair address registers 403 that have a valid bit set. The valid bit convention (e.g., in the example of FIG. 7, setting bit 31 to indicate a valid address), also enables firmware to distinguish between an unprogrammed address slot 502 in the reserved region 500 of the OTP 107 and the memory address numerically equivalent to the value of an unprogrammed OTP in the address slot, i.e., in the case of an Address of a word repair Address-Data pair slot 502 that was programmed with a memory address value that is numerically equivalent to an unprogrammed OTP word, the valid bit enables the firmware to detect that the slot 502 was in fact programmed.

Once an available word repair Address-Data slot n is located within the reserved OTP region, the mismatch address from above is bitwise OR'd with the valid bit, and the result is burned to the Word Repair slot_n.Address word in the OTP reserved region (step 605). The target data that is intended for the mismatch address (the contents of the RAM buffer address corresponding to the target mismatched OTP address) is then burned to the Word Repair slot_n.Data word in the OTP reserved region (step 607). Each such programming of a reserved Word Repair Address-Data slot in OTP effectively reduces the number of available slots for future Word Repair by 1. The Word Repair registers are then re-loaded (step 609) with the Word Repair Address-Data slots in OTP, so that the corrected value in the Word Repair Data Register gets used on any read-back of the repaired address. Once the mismatched location has been corrected using the Word Repair apparatus, the remainder of the OTP memory region may be programmed normally starting from the mismatch address+1 (e.g., continue to step 321 of FIG. 3). The Address-Data pairs programmed to the Word Repair Address-Data slots in OTP (and subsequently loaded into the Word Repair Registers in the case of the hardware-based substitution scheme) may be referred to herein as correction information.

Figure 7:
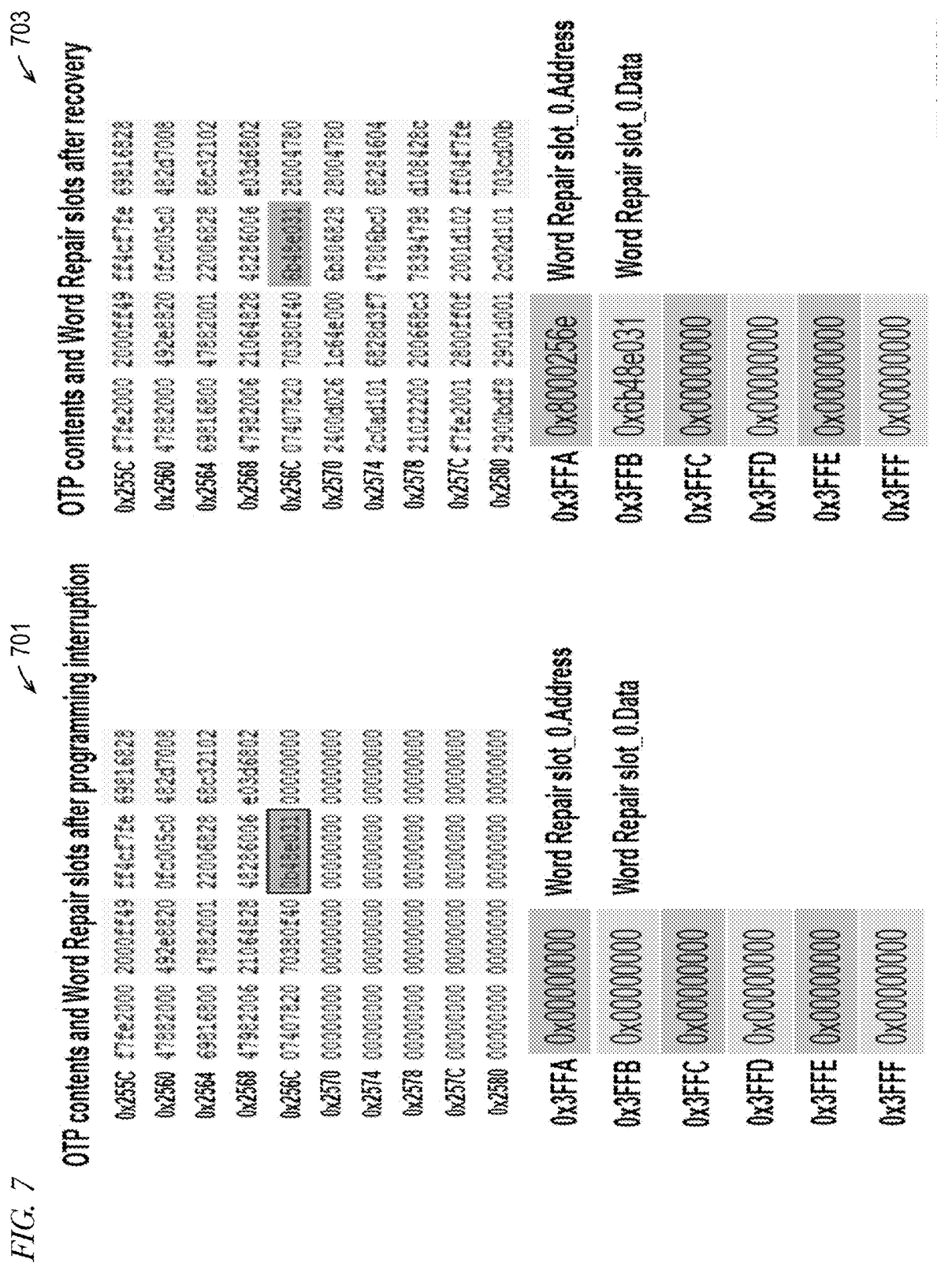

FIG. 7 shows an example snapshot 701 of an OTP memory region after an interrupted programming attempt, together with the final contents 703 after a subsequent re-programming sequence of the same memory region using Word Repair to correct the corrupted value that occurred due to the programming interruption. The OTP address range shown is from 0x255c-0x2583, and the OTP reserved locations for the Word Repair Address-data slots are from 0x3ffa-0x3fff (i.e. 3 Word Repair slots for this example embodiment). As can be seen in FIG. 7, the programming was interrupted at address 0x256e, and not all bits were burned correctly, i.e. the value of 0x0b48e031 is seen instead of the correct value 0x6b48e031. On the re-programming sequence for the same memory region, the method and apparatus to detect and correct the corrupted address was engaged (319 of FIG. 3), which found Word Repair Address-Data slot 0 available for Word Repair (601 of FIG. 6). Word Repair slot_0.Address was populated with the address value of the corrupted location, and slot_0.Data was populated with the correct data value. The example of FIG. 7 uses bit 31 of the slot Address as the valid bit used by the Word Repair Registers.

In one embodiment, the firmware-based substitution scheme operates as follows. In response to a read request (e.g., a load instruction being executed by the MCU) that specifies an OTP address, the ECC checking logic in the OTP detects an ECC signature mismatch and generates an interrupt to the MCU. The ECC fault handler executing on the MCU compares the OTP address specified by the read request with the addresses in the OTP reserved Address-Data slots 502 for a valid match. If there is a valid match, the ECC fault handler causes the faulting load instruction to receive the correct data from the valid matching Address-Data slot 502 (e.g., manipulates the stack such that the destination register of the faulting load instruction receives the correct data upon return from the ECC fault handler). In the hardware-based embodiment, when the ECC checking logic detects an ECC signature mismatch in response to the read request from the OTP and the Word Repair Registers return the correct data to the read request (i.e., substitute the correct data for the corrupted data), then the ECC fault interrupt is masked.

In one embodiment, the OTP memory includes code executable by the MCU, and at power up the MCU executes a boot loader that copies the code from the OTP to the RAM buffer. As the boot loader reads the code from the OTP to perform the copy, corrupted content of the OTP is corrected by the read-back substitution methods described herein, e.g., hardware-based scheme (e.g., word repair registers 105 of FIG. 1) or firmware-based scheme, so that the copy of the code in the RAM buffer is correct. In one embodiment, the boot loader resides in a dedicated region of the OTP (e.g., that is mapped to the reset vector of the MCU). In another embodiment, the boot loader resides in a non-programmable read-only memory (ROM) of the embedded device. The boot loader copies the code from the OTP memory to the RAM buffer and executes the code from the RAM buffer rather than from the OTP. In one embodiment, the ROM contains the code that performs the resuming and recovery checks (e.g., of FIGS. 2, 3 and 6) for a previously failed attempt to program the OTP. In another embodiment, the OTP itself contains the code that performs the resuming and recovery checks for a previously failed OTP programming attempt; however, the code must have been successfully burned into the OTP in the previous attempt, i.e., the programming failure must not have occurred during burning of the code into the OTP.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments, likewise, with the benefit of this disclosure, will be apparent to those having ordinary skill in the art, and such embodiments should be deemed as being encompassed herein.

The description herein sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

The invention claimed is:

1. A system, comprising:
a non-volatile one-time programmable (OTP) memory device;
a processor;
hardware registers;
repair detection hardware;
wherein during a programming operation of the non-volatile OTP memory device:
in response to the system beginning a field update, the system detects for a prior programming attempt of the non-volatile OTP memory device;
in response to the system detecting the prior programming attempt, the system determines and identifies corrupted OTP content at an address of a first location of the non-volatile OTP memory device and selectively stores correction information in a second location of the non-volatile OTP memory device and resumes programming the field update; and
wherein the correction information includes the address of the corrupted OTP content and correct data from the field update;
wherein after the system stores the correction information, the system reads the correction information from the second location and loads the correction information into the hardware registers;
wherein during a read operation that specifies the corrupted OTP content address previously stored in the non-volatile OTP memory device:
the repair detection hardware detects a match of the corrupted OTP content address specified by the read request with the address of the corrupted OTP content included in the correction information and loaded into the hardware registers; and
the system uses the correct data from the field update of the correction information loaded into the hardware registers to return to the read operation the correct data rather than the corrupted OTP content from the non-volatile OTP memory device.

2. The system of claim 1,
wherein the one or more hardware registers are loaded during initialization of the system from the OTP memory device with the stored correction information.

3. The system of claim 1, further comprising:
wherein the non-volatile OTP memory device includes:
an error correction code (ECC) bank that holds a corresponding ECC signature for each word written to the non-volatile OTP memory device; and
ECC hardware that generates an ECC signature of a word read from the non-volatile OTP memory device and indicates a mismatch between the generated ECC signature and the corresponding ECC signature held in the ECC bank; and
wherein in response to determining and identifying the corrupted OTP content, the system further writes a value to the word of the non-volatile OTP memory device at the address of the corrupted OTP content to cause the generated ECC signature to mismatch the corresponding ECC signature held in the ECC bank.

4. The system of claim 3, further comprising:
a controller programmed to:
execute an instruction that requests the read operation that specifies the corrupted OTP content address;
in response to the ECC hardware indicating the mismatch, detect a valid match between the address specified by the read operation and the address included in the correction information stored in the non-volatile OTP memory device; and
return to the instruction the correct data included in the correction information stored in the non-volatile OTP memory device.

5. The system of claim 1,
wherein the system detects for a prior programming attempt by comparing content in the non-volatile OTP memory device with corresponding content of the field update.

6. The system of claim 5,
wherein the system determines and identifies the corrupted OTP content at the address by detecting the content of the non-volatile OTP memory device at the address mismatches the corresponding content of the field update.

7. The system of claim 6,
wherein when the system detects the mismatching content of the non-volatile OTP memory device at the address has an unprogrammed OTP value, the system resumes programming the field update at the address without storing the correction information in the non-volatile OTP memory device.

8. An apparatus, comprising:
a one-time programmable (OTP) memory;
a controller for controlling programming of the OTP memory;
word repair registers loadable with data and mappable to an address of the OTP memory; and
wherein the controller is configured to:
detect that a previous attempt to program a memory region of the OTP memory was interrupted;
resume programming the OTP memory at an address where the previous programming attempt was interrupted leaving a word at the address partially programmed;
program a reserved location of the OTP memory with the address and with correct data for the address; and
read the address and the correct data from the reserved location and load the word repair registers with the correct data for the address and map the word repair registers to the address of the OTP memory that has been partially programmed due to interruption; and
repair detection hardware configured to detect a match of a read request address with the address to which the word repair registers are mapped and in response provide the correct data from the word repair registers to the read request as a substitute for the partially programmed word at the address.

9. A method, comprising:
receiving, from a host, content to be programmed to a device having a one-time programmable (OTP) memory;
detecting that the OTP memory has already been previously programmed;
determining whether a word of the content to be programmed at a first location of the OTP memory does not match a corresponding word currently in the first location;
programming, selectively based on said determining, correction information to a second location of the OTP memory different from the first location, wherein the correction information includes the word of the content to be programmed and an address of the first location;
detecting, subsequent to said programming, a request to read an address of the OTP memory that matches the address included in the correction information; and
returning, to the read request, the word included in the correction information from the second location as a substitute for the word currently in the first location;
by code executed on a processor of the device at initialization of the device after said programming the correction information to the second location and prior to said detecting the request to read the address:
reading the correction information from the second location in the OTP memory; and
loading the correction information into hardware registers of the device; and
wherein said returning, to the read request, the word included in the correction information from the second location as the substitute for the word currently in the first location comprises:
detecting, by repair detection hardware, a match of the read request address with the correction information address loaded into the hardware registers and in response providing the correction information word from the hardware registers to the read request.

10. The method of claim 9, further comprising:
programming to the OTP memory at locations sequential to the first location a remainder of the content after the non-matching word, after said programming the correction information to the second location.

11. The method of claim 9, further comprising:
when the first location has an unprogrammed value, programming to the OTP memory at locations beginning at the first location a remainder of the content at the non-matching word rather than said programming the correction information.

12. The method of claim 9, further comprising:
reporting a failure to the host when a location sequential to the first location does not have an unprogrammed value.

13. The method of claim 9,
wherein the correction information further includes validity indicator.

14. The method of claim 9, wherein the second location is in a pre-defined location within the OTP memory.

15. The method of claim 9, further comprising:
when the word of the content to be programmed at the first location does not match the corresponding word currently in the first location:
  altering the content of the first location of the OTP memory to guarantee a detectible error condition on subsequent reads of the first location.

16. The method of claim 15, wherein said altering the content of the first location comprises inverting one or more bits of the first location to force detection of an uncorrectable error by error correcting code (ECC) hardware.

17. The method of claim 15, further comprising:
detecting, by the OTP memory in response to the read request, the error condition;
interrupting a processor of the device in response to said detecting; and
wherein said returning, to the read request, the word included in the correction information from the second location as the substitute for the word currently in the first location comprises the processor executing code in response to said interrupting to:
  detect a match of the read request address with the correction information address at the second location and in response provide the correction information word from the second location to the read request.

18. The method of claim 9, further comprising:
reporting a failure to the host when a reserved region of the OTP for writing correction information has been consumed.

* * * * *